United States Patent
Oh et al.

(10) Patent No.: US 9,674,943 B2
(45) Date of Patent: Jun. 6, 2017

(54) ACTUATION MECHANISMS FOR ELECTRICAL INTERCONNECTIONS

(71) Applicant: Intel Corporation, Santa Clara, CA (US)

(72) Inventors: Youngseok Oh, Portland, OR (US); Joe Walczyk, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 197 days.

(21) Appl. No.: 13/707,032

(22) Filed: Dec. 6, 2012

(65) Prior Publication Data

US 2014/0158416 A1 Jun. 12, 2014

(51) Int. Cl.
*H05K 1/02* (2006.01)
*H05K 1/11* (2006.01)
*H05K 3/40* (2006.01)

(52) U.S. Cl.
CPC .. *H05K 1/0268* (2013.01); *H01L 2224/16225* (2013.01); *H01L 2924/15311* (2013.01); *H05K 1/116* (2013.01); *H05K 3/4046* (2013.01)

(58) Field of Classification Search
None
See application file for complete search history.

(56) References Cited

U.S. PATENT DOCUMENTS

| | | | | |
|---|---|---|---|---|
| 3,148,356 A * | 9/1964 | Hedden, Jr. | ......... | H01R 12/526 174/260 |
| 4,650,933 A * | 3/1987 | Benda | .................... | H04Q 1/142 379/21 |
| 4,707,655 A * | 11/1987 | Kruger | ............... | H01R 13/2421 324/755.01 |
| 5,000,691 A * | 3/1991 | Olsson | ................. | H05K 3/3447 439/83 |
| 5,388,997 A * | 2/1995 | Grange | ............. | H01R 13/2421 347/50 |
| 5,530,375 A * | 6/1996 | Seidel | ................ | G01R 31/2863 324/750.05 |
| 5,929,373 A | 7/1999 | Schiavo et al. | | |

(Continued)

FOREIGN PATENT DOCUMENTS

| CN | 1471751 A | 1/2004 |
|---|---|---|
| CN | 101231306 A | 7/2008 |

(Continued)

OTHER PUBLICATIONS

"Chinese Application Serial No. 201310656348.1, Office Action mailed Feb. 14, 2016", w/ English Translation, 14 pgs.

(Continued)

*Primary Examiner* — Paresh Patel
(74) *Attorney, Agent, or Firm* — Schwegman Lundberg & Woessner, P.A.

(57) ABSTRACT

Some embodiments described herein include apparatuses and methods of forming such apparatuses. In one such embodiment, an apparatus may include an electronic arrangement, a first die, and a second die coupled to the first die and the electronic arrangement. The electronic arrangement may include an opening. At least a portion of the die may occupy at least a portion of the opening in the electronic arrangement. Other embodiments including additional apparatuses and methods are described.

8 Claims, 7 Drawing Sheets

(56) References Cited

U.S. PATENT DOCUMENTS

| | | | | |
|---|---|---|---|---|
| 6,642,728 | B1* | 11/2003 | Kudo | H01L 21/67242 |
| | | | | 324/755.02 |
| 6,685,492 | B2* | 2/2004 | Winter et al. | 439/219 |
| 6,957,986 | B2* | 10/2005 | Jing | H01R 13/2421 |
| | | | | 439/700 |
| 7,288,952 | B2* | 10/2007 | Goto | 324/755.05 |
| 8,087,956 | B2* | 1/2012 | Nakayama | G01R 1/045 |
| | | | | 439/700 |
| 8,390,308 | B2* | 3/2013 | Carney | G01R 1/07314 |
| | | | | 324/756.01 |
| 2004/0246014 | A1* | 12/2004 | Goto | 324/761 |
| 2014/0015558 | A1* | 1/2014 | Akahori | G01R 1/067 |
| | | | | 324/755.01 |

FOREIGN PATENT DOCUMENTS

| | | | |
|---|---|---|---|
| CN | 101315411 A | | 12/2008 |
| CN | 202002950 U | | 10/2011 |
| CN | 103855496 A | | 6/2014 |
| JP | 06308156 A | * | 11/1994 |
| JP | 09178772 A | * | 7/1997 |
| JP | 2004138592 A | * | 5/2004 |
| JP | 2004340867 A | * | 12/2004 |
| JP | 2008298792 A | | 11/2008 |

OTHER PUBLICATIONS

"Chinese Application Serial No. 201310656348.1, Office Action mailed May 20, 2016", W/ English Translation, 7 pgs.

"Chinese Application Serial No. 201310656348.1, Response filed Mar. 1, 2016 to Office Action mailed Feb. 14, 2016", W/ English Translation, 11 pgs.

* cited by examiner

ACTUATION MECHANISMS FOR ELECTRICAL INTERCONNECTIONS

TECHNICAL FIELD

Embodiments described herein pertain to electrical devices. Some embodiments relate to electrical interconnections involving integrated circuit packages and circuit boards.

BACKGROUND

Many electronic items including desktop, laptop, and tablet computers, cellular phones, and other electronic items, usually have one or more electrical devices, such as a memory device to store information, a processor to process information, or both the memory device and the processor. The device may be part of an integrated circuit (IC) package. Information exchanged between the device of the IC package and other devices may be conducted in the form of electrical signals passing through electrical connections between the IC package and the other devices. The electrical connections may be formed in part by conductive connections (e.g., solder balls) located on the IC package and interconnections located on a circuit board. In some cases, such electrical connections may be temporarily formed for testing the device during a test. Factors such as package warpage and manufacturing tolerances may degrade such electrical connections. Designing electrical interconnections to account for such factors may sometimes pose a challenge.

DETAILED DESCRIPTION

Figure 1:
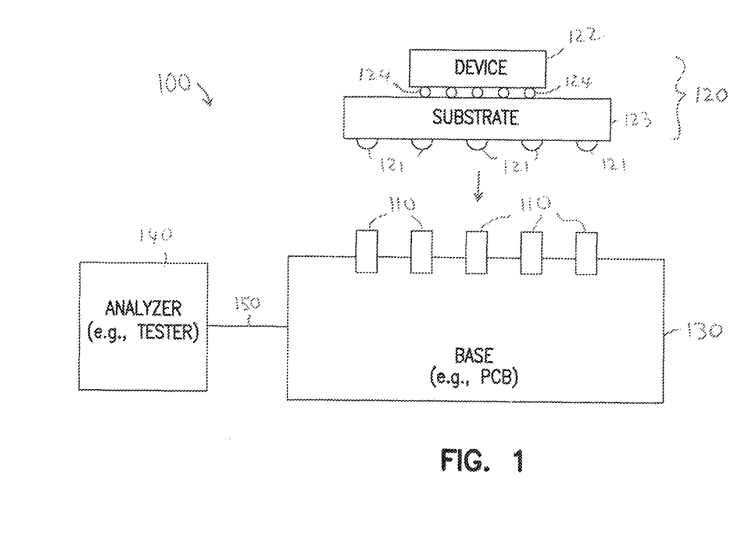
FIG. 1 shows a block diagram of an electronic arrangement including interconnections for providing electrical connections between an electronic assembly and a base, according to some embodiments described herein.

FIG. 1 shows a block diagram of an electronic arrangement 100 including interconnections 110 for providing electrical connections between an electronic assembly 120 and a base 130, according to some embodiments described herein. Base 130 may include a circuit board (e.g., a printed circuit board, such as a motherboard). Electronic assembly 120 may include an integrated circuit (IC) package or other electronic devices. Electronic assembly 120 may include conductive contacts (e.g., solder balls) 121 to be coupled to respective interconnections 110.

Electronic assembly 120 may include a device 122 attached to a substrate (e.g., a package substrate) 123 through conductive contacts (e.g., solder balls) 124. Substrate 123 may include conductive paths (not shown) coupled to conductive contacts 121 and 124. Device 122 may include a semiconductor (e.g., silicon) die. The die may include circuitry to perform one or more functions, such as processing information, storing information, or other functions. For example, the die in device 122 may include a processor (e.g., including transistors, arithmetic logic units, and other components) that may include a central processing unit (CPU), a graphics processing unit (GPU), or both. The processor may also include application specific integrated circuits (ASIC).

Examples of the IC package in electronic assembly 120 may include a ball grid array (BGA) packaging type, land grid array (LGA) packaging type, pin grid array (PGA) packaging type, or other types of packaging. Electronic assembly 120 may be included in electronic items such as desktop, laptop, and tablet computers, e-readers (e.g., e-book readers), personal digital assistants (PDAs), cellular telephones, smart phones, servers, web appliances, set-top boxes (STBs), network routers, network switches, network bridges, or other types of electronic items.

As shown in FIG. 1, base 130 may be coupled to an analyzer 140 through an interface 150. Interface 150 may include conductive paths (e.g., electrical conductors) coupled to interconnections 110 to allow communication (e.g., in the form of signals) between analyzer 140 and electronic assembly 120 through interconnections 110 and interface 150. Analyzer 140 may include a tester (e.g., a computer) to test electronic assembly 120 (e.g., to test device 122), base 130, or both. Thus, in electronic arrangement 100, device 122 may be may be a device under test (DUT).

FIG. 1 shows only five interconnections 110 as an example. The number of interconnections 110 may vary. For example, electronic arrangement 100 may include numerous interconnections 110 arranged in rows and columns. For simplicity, FIG. 1 show interconnections 110 located in only a portion (e.g., top portion) of base 130. Interconnections 110, however, may include components located in other portions (e.g., middle and bottom portions) of base 130. For example, interconnections 110 may include interconnections having components described in more detail below with reference to FIG. 2A through FIG. 4D.

Figure 2A:
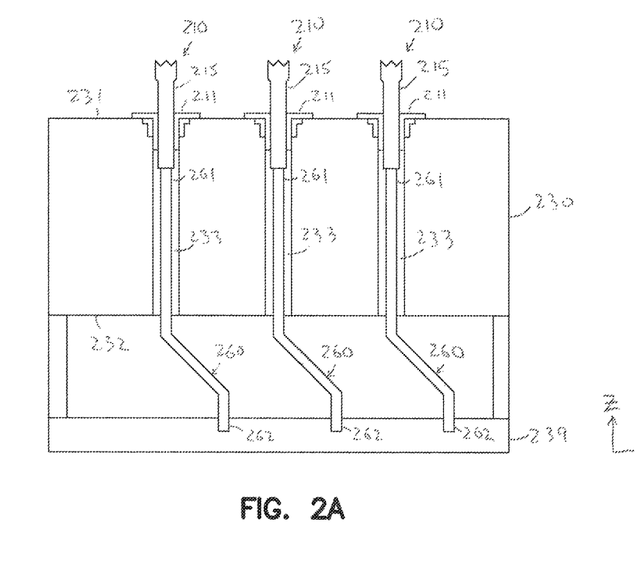
FIG. 2A, FIG. 2B, FIG. 2C, and FIG. 2D show different views of interconnections including a crank-shaped spring, according to some embodiments described herein.
Figures 2B, 2C:
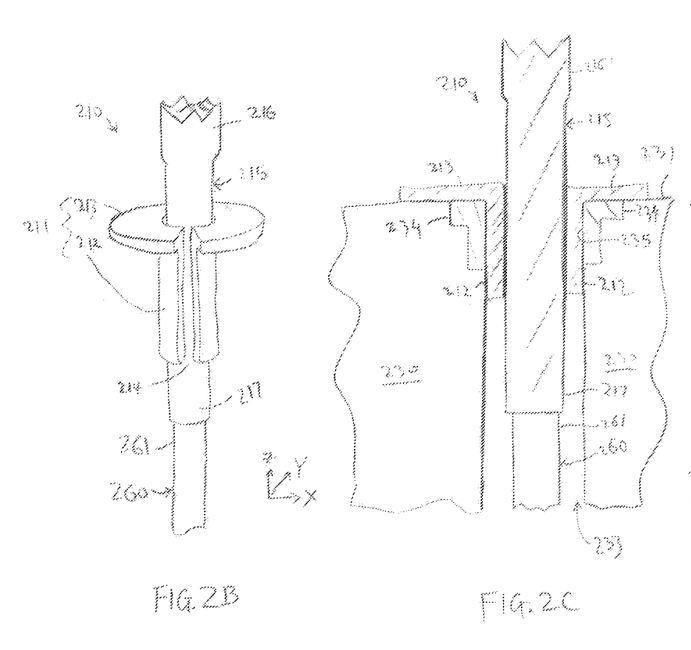
Figure 2D:
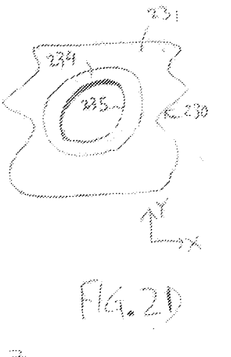

FIG. 2A, FIG. 2B, FIG. 2C, and FIG. 2D show different views of interconnections 210 and a base 230, according to some embodiments described herein. FIG. 2A shows a side view of interconnections 210 and base 230. FIG. 2B shows a perspective view (with respect to x, y, and z directions) of a portion of one of interconnections 210 of FIG. 2A. FIG. 2C shows a cross section of a portion of interconnections 210 and base 230 of FIG. 2A. FIG. 2D shows a top view of a via 234 of base 230 of FIG. 2C.

Interconnections 210 and base 230 in FIG. 2A through FIG. 2D may correspond to interconnections 110 and base 130, respectively, of FIG. 1. FIG. 2A shows only three interconnections 210 as an example. The number of interconnections 210 may vary.

As shown in FIG. 2A, base 230 may include surfaces (e.g., top and bottom surfaces) 231 and 232, and an opening 233 extending between surfaces 231 and 232 at each of interconnections 210. Base 230 may include a via 234 (FIG. 2C and FIG. 2D) associated with opening 233. Via 234 may include an electrically conductive via (e.g., a metal via). At least a portion of via 234 may be located inside (e.g., near surface 231) opening 233. Via 234 may include a sidewall 235 having a cylindrical shape (e.g., a cylindrical sidewall 235). Base 230 may include conductive paths (not shown) coupled to via 234 to provide electrical communication (e.g., in the form of signals) to and from one or more of interconnections 210 through via 234. Such electrical communication may include signals carrying power supply, data information, control information, or other kinds of information.

Each of interconnections 210 (FIG. 2A, FIG. 2B, and FIG. 2C) may include electrical components and mechanical components. The electrical components may include a collar 211 and a pin 215 having conductive material (e.g., metal such as copper). The mechanical components may include a spring 260.

As shown in FIG. 2B and FIG. 2C, collar 211 may include portions 212 and 213. Portion 212 (FIG. 2B) may have a cylindrical shape that may form a slender cylinder. Portion 212 (FIG. 2C) may be located inside opening 233 of base 230 and coupled to via 234. Portion 212 may directly contact sidewall 235 of via 234 and conform to sidewall 235. Portion 212 may be inserted into via 234, such that portion 212 may be coupled to via 234 by press fit coupling. Portion 213 (FIG. 2B) may have a ring shape with a dimension (e.g., outer diameter) greater than a diameter of the opening 233. This may allow portion 213 to form a stopper (e.g., a mechanical hinder) to prevent collar 211 (e.g., entire collar 211) from sliding into via 234. Thus, as shown in FIG. 2C, portion 213 may be located outside via 234 and outside opening 233.

As shown in FIG. 2B, collar 211 may include a slit 214 extending along the length (e.g., in the z-direction) of collar 211. Slit 214 may separate portion 212 such that portion 212 may not be a continuous portion (e.g., at least part of portion 212 is void of material at slit 214). Slit 214 may also separate portion 213 such that portion 213 may not be a continuous portion (e.g., at least part of portion 213 is void of material at slit 214). In an alternative structure, collar 211 may not include a slit (e.g., slit 214) in one or both of portions 212 and 213. Thus, in an alternative structure, portion 212 may be a continuous portion, portion 213 may be a continuous portion, or both portions 212 and 213 may be continuous portions.

Pin 215 (FIG. 2B and FIG. 2C) includes ends (e.g., pin heads) 216 and 217. End 216 (FIG. 2C) may be located outside base 230 (e.g., outside opening 233 of base 230). End 217 may be located inside base 230 (e.g., inside opening 233 of base 230). Pin 215 may be electrically coupled (e.g., directly contacting) collar 211. For example, as shown in FIG. 2C, a portion between ends 216 and 217 (e.g., a body) of pin 215 may directly contact portion 212 of collar 211. Pin 215 may be arranged to move (e.g., slide) in a direction (e.g., z-direction) between ends 216 and 217 while maintaining electrical contact with collar 211.

Collar 211, pin 215, and via 234 may establish an electrical connection (e.g., a temporary electrical connection during a test) to allow monitoring of electrical communication to and from a device (e.g., a DUT, such as device 122 of FIG. 1) coupled to pin 215 of each of interconnections 210.

Spring 260 (FIG. 2A) may include a crank-shaped spring. For example, spring 260 may include multiple segments (e.g., three segments as shown in FIG. 2A) that are substantially straight. The multiple segments may form different angles (e.g., different bends) in spring 260. Spring 260 includes ends 261 and 262. End 261 may be coupled (e.g., directly contacting) to end 217 of pin 215 FIG. 2C). End 262 may be coupled (e.g., fixed) to a fixture 239. Spring 260 may include conductive material (e.g., metal). Alternatively, spring 260 may include non-conductive material (e.g., non-metal material), such that spring 260 may not be electrically coupled to pin 215.

Spring 260 may form a mechanical actuator to enable pin 215 to move (e.g., slide) in a direction between ends 216 and 217 when a force is applied to at least one of ends 216 and 217. For example, spring 260 may be compressed (e.g., in the z-direction) when an electronic assembly (e.g., electronic assembly 120 of FIG. 1) is attached to pin 215 (e.g., pressed against pin 215 in the z-direction) of each of interconnections 210. Thus, the arrangement of spring 260 and pin 215 may be associated with distributed compliant mechanism, providing functions of spring and load transfer.

The arrangement of spring 260, collar 211, and pin 215 may isolate spring 260 from an electrical path formed by pin 215, collar 211, and via 234. Thus, in comparison with a conventional interconnection having a spring included in an electrical path between two pin heads (e.g., a pogo-pin), each of interconnections 210 may have a shorter electrical path formed by pin 215, collar 211, and via 234. This may lead to a lower profile (e.g., smaller interconnection dimension in the z-direction) for interconnections 210 between base 230 and other electronic devices (e.g., between base 230 and electronic assembly 120 of FIG. 1). Lower profile may improve device electrical performance, such as signal integrity and power delivery.

Each of interconnections 210 may have a relatively large pin stroke with adequate force to make electrical contact with another device (e.g., with electronic assembly 120 of FIG. 1). The pin stroke refers a distance that pin 215 may move (e.g., slide) from a reference point to another point (e.g., move in the z-direction). In some cases, thinner and smaller device form factor (e.g., in FIG. 1, thinner device 120, substrate 122, or both) may impact negatively to the planarity of semiconductor package (e.g., electronic assembly 120 of FIG. 1). In some of such cases, a relatively large pin stroke may be needed to improve the quality of electrical connections (e.g., connections between base 230 and electronic assembly 120 of FIG. 1) that may be compromised when factors such as package warpage and manufacturing tolerances are present. In a conventional interconnection (e.g., a pogo-pin), it may be difficult (or unachievable in some cases) to increase pin stroke without decreasing pin force or increasing the length of the pin. However, if such a pin force is decreased in (e.g., in a pogo-pin) in order to increased pin stroke, electrical contact between the pin and a contact of a device (coupled to the pin) may be degraded (e.g., increased in resistance).

In interconnections 210, however, the arrangement of spring 260 and pin 215 may enable a large pin stroke (e.g., in comparison with a pogo-pin) by distributing the stress induced by displacement and load to the distributed spring mechanism. Thus, in interconnections 210, the pin stroke of pin 215 may be increased without increasing the length of pin 125 or decreasing the pin force. This may improve the quality of electrical connections between base 230 and other devices (e.g., electronic assembly 120 of FIG. 1) when package (e.g., substrate 123) warpage, manufacturing tolerances, or other undesirable factors are present.

Figure 3A:
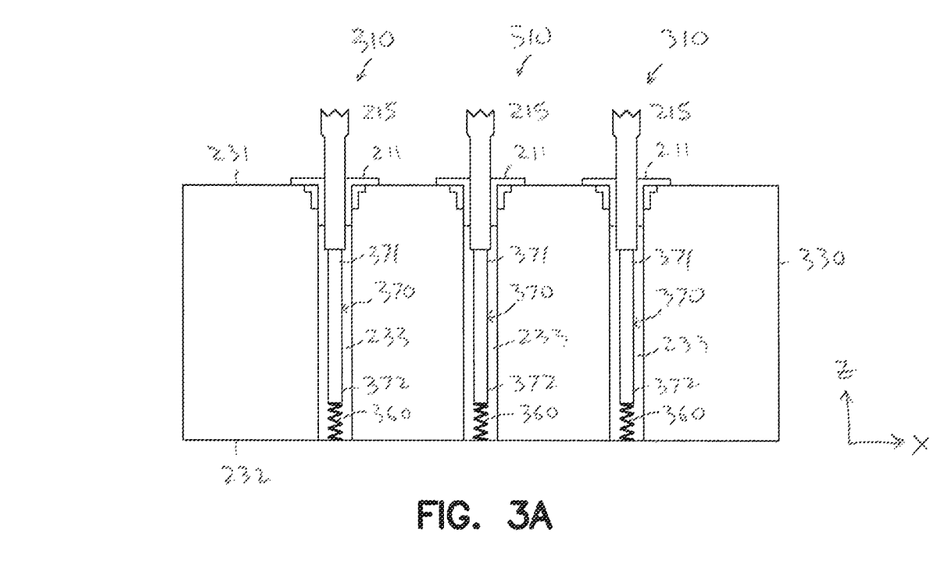
FIG. 3A, FIG. 3B, FIG. 3C, and FIG. 3D show different views of interconnections including a rod and a spring, according to some embodiments described herein.

FIG. 3A, FIG. 3B, FIG. 3C, and FIG. 3D show different views of interconnections 310 having a rod 370 between a pin 215 and a spring 360, and a base 330, according to some embodiments described herein. Interconnections 310 and base 330 in FIG. 3A through FIG. 3D may correspond to interconnections 110 and base 130, respectively, of FIG. 1. FIG. 3A shows only three interconnections 310 as an example. The number of interconnections 310 may vary.

Interconnections 310 and base 330 may include elements similar to or identical to those of interconnections 210 and base 230 (FIG. 2A through FIG. 2D), respectively. Thus, for simplicity, similar or identical elements between interconnections 210 and 310 and between bases 230 and 330 are given the same reference numbers. The description of such similar or identical elements is not repeated in the description of FIG. 3A through FIG. 3D.

Figure 3B:
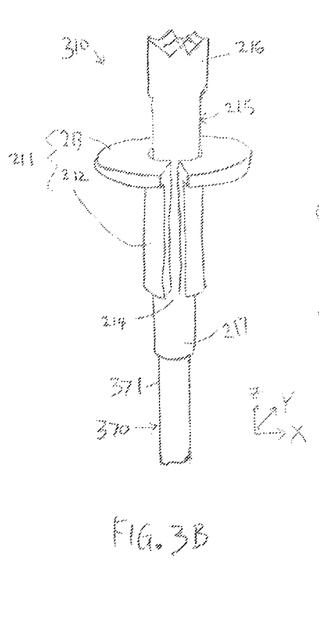
Figures 3C, 3D:
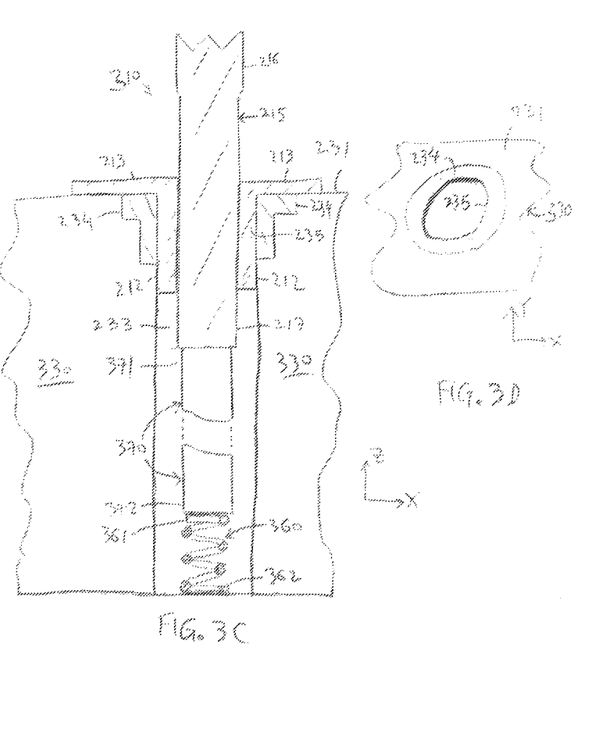

As shown in FIG. 3B and FIG. 3C, each of interconnections 310 may include electrical components formed by collar 211 and pin 215, and mechanical components formed by spring 360 and rod 370. The arrangement of the spring 360, rod 370, and pin 215 may be associated with lumped compliant mechanism. Spring 360 may be coupled to end 217 of pin 215 through rod 370, which enables transferring spring load to the pin 215. Rod 370 may include conductive material (e.g., metal). Alternatively, rod 370 may include non-conductive material (e.g., non-metal material), such that spring 360 may not be electrically coupled to pin 215.

Spring 360 (FIG. 3C) may include a coil spring having ends 361 and 362. End 361 may be coupled (e.g., directly contacting) to end 372 of rod 370. End 362 may be coupled (e.g., fixed) to base 330 (e.g., positioning on the bottom of base 330). Alternatively, spring 360 may include a planar spring.

FIG. 3A and FIG. 3C shows only one spring 360 as an example. Multiple springs may be used. For example, instead of having only one spring 360, two or more springs similar to or identical to spring 360 may be arranged (e.g., stacked) on top of each other inside opening 233.

In comparison with conventional interconnections (e.g., pogo-pins), the arrangement of spring 360, rod 370, and pin 215 may allow interconnections 310 to have a relatively lower profile and larger pin stroke similar to that of spring 260 and pin 215, as described above with reference to FIG. 2A through FIG. 2D.

Figure 4A:
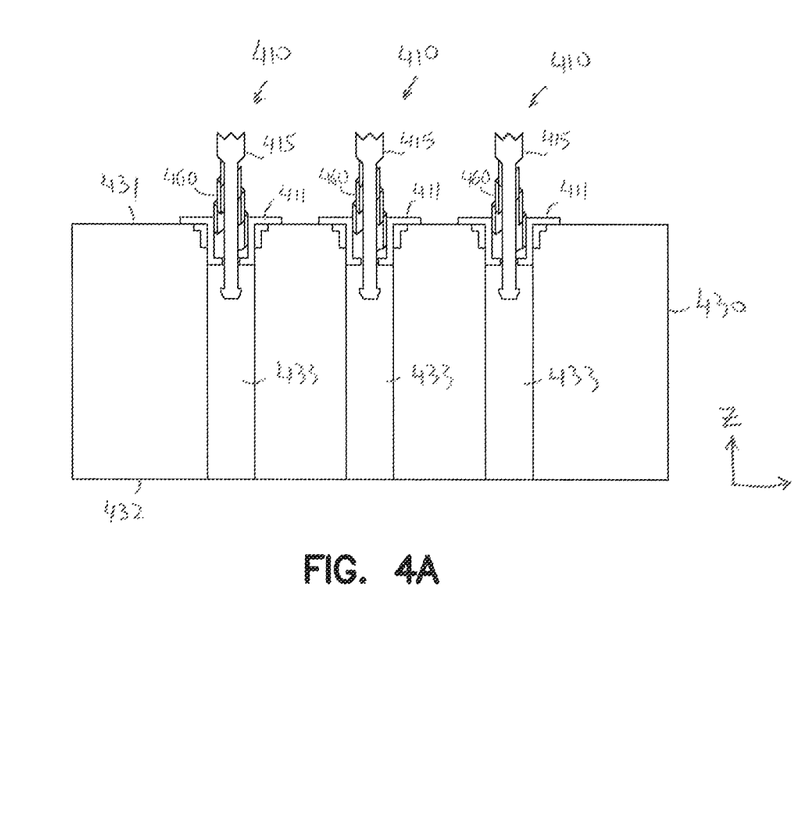
FIG. 4A, FIG. 4B, FIG. 4C, and FIG. 4D show different views of interconnections including a volute spring, according to some embodiments described herein.
Figure 4B:
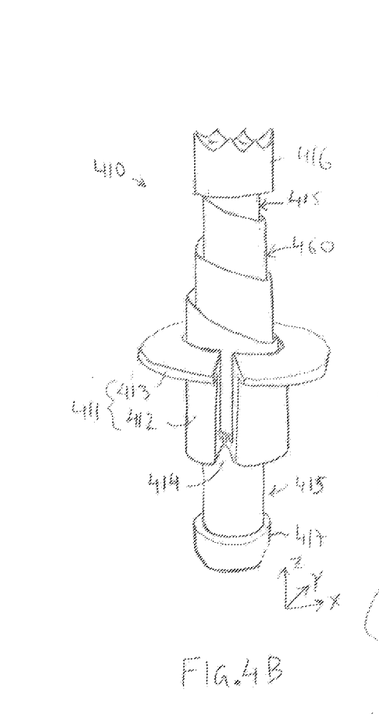
Figure 4C:
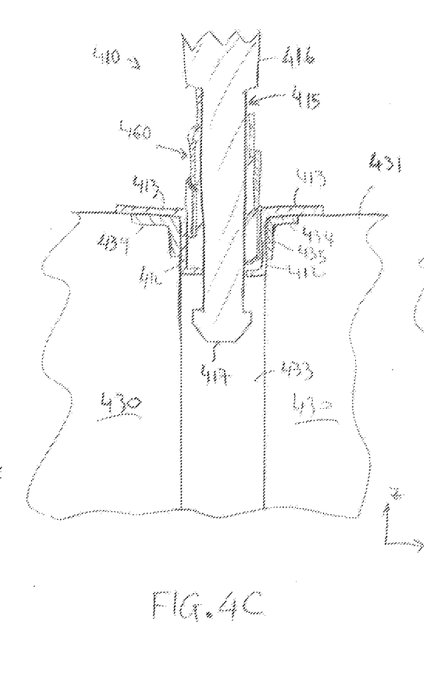
Figure 4D:
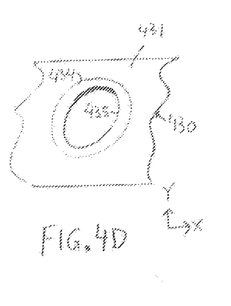

FIG. 4A, FIG. 4B, FIG. 4C, and FIG. 4D show different views of interconnections 410 and a base 430, according to some embodiments described herein. FIG. 4A shows a side view of interconnections 410 and base 430. FIG. 4B shows a perspective view (with respect to x, y, and z directions) of a portion of one of interconnections 410 of FIG. 4A. FIG. 4C shows a cross section of a portion of interconnections 410 and base 430 of FIG. 4A. FIG. 4D shows a top view of a via 434 of base 430 of FIG. 4C.

Interconnections 410 and base 430 in FIG. 4A through FIG. 4D may correspond to interconnections 110 and base 130, respectively, of FIG. 1. FIG. 4A shows only three interconnections 410 as an example. The number of interconnections 410 may vary.

Base 430 may include elements similar to or identical to those of base 230 (FIG. 2A, FIG. 2C, and FIG. 2D). For example, base 430 may include surfaces 431 and 432, an opening 433 and a via 434 (having sidewall 435) at each of interconnections 410. Base 430 may include conductive paths (not shown) coupled to via 434 to provide electrical communication to and from one or more of interconnections 410 through via 434.

As shown in FIG. 4A, FIG. 4B, and FIG. 4C, each of interconnection 410 may include electrical components and mechanical components. The electrical components may include a collar 411 (FIG. 4B) and a pin 415 (FIG. 4B and FIG. 4C) having conductive material (e.g., metal such as copper). The mechanical components may include a volute spring 460 (FIG. 4B and 4C) having conductive material. Volute spring 460 may provide relatively large contact areas contacting collar 411 and pin 415 and provide pin lateral stability.

Collar 411 (FIG. 4B) may include portions 412 and 413 (FIG. 4B and FIG. 4C). Portion 412 may have a cylindrical shape that may form a plump cylinder surrounding at least a portion of volute spring 460. Portion 412 (FIG. 4C) may be located inside opening 433 of base 430 and coupled to via 434. Portion 412 may directly contact sidewall 435 (FIG. 4D) of via 434 and conform to sidewall 435. Portion 412 may be inserted into via 434, such that portion 412 may be coupled to via 434 by press fit coupling. Portion 413 of collar 411 may be located outside opening 433. Portion 413 (FIG. 4B) may have a ring shape with a dimension (e.g., outer diameter) greater than a diameter of the opening 433. This may allow portion 413 to form a stopper (e.g., a mechanical hinder) to prevent collar 411 (e.g., entire collar 411) from sliding into via 434. The stopper may also set a reference z-height at the top (e.g., near surface 431) of base 430 that may eliminate manufacturing tolerance concern on the thickness of base 430.

As shown in FIG. 4B, collar 411 may include a slit 414 extending along the length (e.g., in the z-direction) of collar 411. Slit 414 may separate portion 412 such that portion 412 may not be a continuous portion (e.g., at least part of portion 412 is void of material at slit 414). Slit 414 may also separate portion 413 such that portion 413 may not be a continuous portion (e.g., at least part of portion 413 is void of material at slit 414). In an alternative structure, collar 411 may not include a slit (e.g., slit 414) in one or both portions 412 and 413. Thus, in an alternative structure, portion 412 be a continuous portion, portion 413 be a continuous portion, or both portions 412 and 413 may be continuous portions.

Pin 415 (FIG. 4B and FIG. 4C) includes ends (e.g., pin heads) 416 and 417. End 416 may be located outside base 430 (e.g., outside opening 433 of base 430). End 417 may be located inside base 430 (e.g., inside opening 433 of base 430). End 417 may include a feature (e.g., a snap-in feature) that may allow pin 415 to be inserted (e.g., snapped) into volute spring 460 and collar 411. Pin 415 (FIG. 4A and FIG. 4C) may be electrically coupled (e.g., directly contacting) collar 411. For example, as shown in FIG. 4C, the portion between ends 416 and 417 (e.g., a body) of pin 415 may directly contact portion 412 of collar 411. Pin 415 may be arranged to move (e.g., slide) in a direction (e.g., z-direction) between ends 416 and 417 while maintaining electrical contact with volute spring 460 and collar 411.

As shown in FIG. 4B and FIG. 4C, at least a portion of volute spring 460 may surround at least a portion of pin 415 between ends 416 and 417. Portion 412 may hold and surround at least a portion of the volute spring 460 and a portion of pin 415, such that at least a portion of volute spring 460 may be between portion 412 of collar 411 and a portion of pin 415.

Collar 411, pin 415, volute spring 460, and via 434 may establish an electrical connection (e.g., a temporary electrical connection) to allow monitoring of electrical communication (e.g., in the form of electrical signals) to and from a device (e.g., a DUT, such as device 122 of FIG. 1) coupled to pin 415 of each of interconnections 410.

Volute spring 460 may form a mechanical actuator to enable pin 415 to move (e.g., slide) in a direction between ends 416 and 417 when a force is applied to at least one of ends 416 and 417. For example, volute spring 460 may be compressed (e.g., in the z-direction) when an electronic assembly (e.g., electronic assembly 120 of FIG. 1) is attached to pin 415 (e.g., pressed against pin 415 in the z-direction) of each of interconnections 410.

Each of interconnections 410 may have a shorter electrical path (e.g., formed by pin 415, spring 460, collar 411, and via 434) in comparison with a conventional interconnection (e.g., a pogo-pin). This may lead to a lower profile for interconnections 410 between base 430 and other electronic devices (e.g., between base 430 and electronic assembly 120 of FIG. 1). Each of interconnections 410 may also have a relatively large pin stroke in comparison with a conventional interconnection (e.g., a pogo-pin).

The above description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An electronic arrangement comprising:
   a collar electrically coupled to a base;
   a pin electrically coupled to the collar, the pin including a first end outside the base and a second end inside the base; and
   a component to enable the pin to move in a Z-direction between the first and second ends, the component including a spring, the spring including a first end, a second end, and a plurality of straight segments at different angles relative to each other and, the first end of the spring contacting the second end of the pin, and the second end of the spring coupling to a fixture outside an opening of the base, wherein the base includes an electrically conductive via, and the collar includes at least a portion electrically coupled to the electrically conductive via and located inside the electrically conductive via.

2. The electronic arrangement of claim 1, wherein the spring is not electrically coupled to the pin.

3. The electronic arrangement of claim 1, her comprising:
   an additional collar electrically coupled to the base;
   an additional pin electrically coupled to the additional collar, the additional pin including a first end outside the base and a second end inside the base; and
   an additional component to enable the additional pin to move in a direction between the first and second ends of the additional pin.

4. The electronic arrangement of claim 1, wherein the base includes a printed circuit board.

5. The electronic arrangement of claim 1, wherein the base includes an interface arranged to be coupled to an analyzer in a test.

6. The electronic arrangement of claim 1, wherein the pin is arranged to be coupled to an electronic assembly in the test.

7. The electronic arrangement of claim 1, wherein the collar includes at another portion located outside the electrically conductive via.

8. An electronic arrangement comprising:
   a collar electrically coupled to a base;
   a pin electrically coupled to the collar, the pin including a first end outside the base and a second end inside the base; and
   a component to enable the pin to move in a Z-direction between the first and second ends, the component including a spring, the spring including a first end, a second end, and a plurality of straight segments at different angles relative to each other and, the first end of the spring contacting the second end of the pin, and the second end of the spring coupling to a fixture outside an opening of the base, wherein base includes an opening, the collar includes a collar portion located outside the opening of the base, and the collar portion has a dimension greater than a diameter of the opening of the base.

* * * * *

UNITED STATES PATENT AND TRADEMARK OFFICE
CERTIFICATE OF CORRECTION

PATENT NO. : 9,674,943 B2
APPLICATION NO. : 13/707032
DATED : June 6, 2017
INVENTOR(S) : Oh et al.

It is certified that error appears in the above-identified patent and that said Letters Patent is hereby corrected as shown below:

In the Claims

In Column 8, Line 3, in Claim 3, delete "her" and insert --further-- therefor

Signed and Sealed this
Fourth Day of June, 2019

Andrei Iancu
*Director of the United States Patent and Trademark Office*